US010395745B2

(12) United States Patent
Horch et al.

(10) Patent No.: US 10,395,745 B2
(45) Date of Patent: Aug. 27, 2019

(54) ONE-TIME PROGRAMMABLE BITCELL WITH NATIVE ANTI-FUSE

(71) Applicant: Synopsys, Inc., Mountain View, CA (US)

(72) Inventors: Andrew E. Horch, Seattle, WA (US); Martin Luc Cecil Arthur Niset, Seattle, WA (US); Ting-Jia Hu, Seattle, WA (US)

(73) Assignee: Synposys, Inc., Mountain View, CA (US)

( * ) Notice: Subject to any disclaimer, the term of this patent is extended or adjusted under 35 U.S.C. 154(b) by 0 days.

(21) Appl. No.: 15/791,023

(22) Filed: Oct. 23, 2017

(65) Prior Publication Data

US 2018/0114582 A1 Apr. 26, 2018

Related U.S. Application Data

(60) Provisional application No. 62/411,450, filed on Oct. 21, 2016.

(51) Int. Cl.
*G11C 17/16* (2006.01)
*H01L 29/78* (2006.01)
(Continued)

(52) U.S. Cl.
CPC ............ *G11C 17/165* (2013.01); *G11C 17/16* (2013.01); *G11C 17/18* (2013.01);
(Continued)

(58) Field of Classification Search
CPC ........... H01L 27/11206; H01L 29/7833; H01L 23/5252; G11C 17/165
See application file for complete search history.

(56) References Cited

U.S. PATENT DOCUMENTS 6,294,809 B1 9/2001 Logie
6,630,724 B1 10/2003 Marr
(Continued)

OTHER PUBLICATIONS

"Kilopass Embedded XPM Technology: A new Field Programmable Non-Volatile Memory," Kilopass Corporation, Jan. 29, 2009, 9 pages.

(Continued)

*Primary Examiner* — Allison Bernstein
(74) *Attorney, Agent, or Firm* — Fenwick & West LLP

(57) ABSTRACT

A one-time programmable memory device includes a well of a first polarity in a semiconductor substrate. A lightly-doped drain (LDD) region is above one portion of the well. The LDD region has a first doping concentration and a second polarity that is opposite the first polarity. A source region or a drain region of the second polarity is above another portion of the well. The source region or the drain region has a second doping concentration that is higher than the first doping concentration. A first breakdown voltage between the LDD region and the well region is higher than a second breakdown voltage between the source region or the drain region and the well region. A select device is positioned at least partially above a portion of the source region or the drain region. The select device is configured to form a channel between the source region or the drain region and the LDD region. An anti-fuse device is positioned at least partially above a portion of the LDD region.

16 Claims, 6 Drawing Sheets

(51) Int. Cl.
*H01L 27/112* (2006.01)
*H01L 23/525* (2006.01)
*G11C 17/18* (2006.01)

(52) U.S. Cl.
CPC .... *H01L 23/5252* (2013.01); *H01L 27/11206* (2013.01); *H01L 29/7833* (2013.01)

(56) References Cited

U.S. PATENT DOCUMENTS

| | | | | |
|---|---|---|---|---|
| 7,504,683 | B2 * | 3/2009 | Candelier | H01L 27/0207 257/296 |
| 7,638,855 | B2 | 12/2009 | Lung | |
| 7,755,162 | B2 | 7/2010 | Kurjanowicz et al. | |
| 7,961,490 | B2 * | 6/2011 | Nevers | G06F 17/5068 365/104 |
| 8,547,763 | B2 * | 10/2013 | Son | G11C 17/16 365/185.01 |
| 8,644,049 | B2 | 2/2014 | Chung | |
| 8,724,363 | B2 | 5/2014 | Lu et al. | |
| 8,848,423 | B2 | 9/2014 | Chung | |
| 8,933,492 | B2 | 1/2015 | Kurjanowicz | |
| 9,007,805 | B2 | 4/2015 | Lu et al. | |
| 9,224,496 | B2 | 12/2015 | Chung | |
| 9,613,714 | B1 | 4/2017 | Wong et al. | |
| 2006/0203591 | A1 | 9/2006 | Lee | |
| 2007/0183181 | A1 | 8/2007 | Peng et al. | |
| 2009/0052220 | A1 | 2/2009 | Kleveland | |
| 2012/0047322 | A1 | 2/2012 | Chung | |
| 2012/0211841 | A1 * | 8/2012 | Kurjanowicz | G11C 17/16 257/369 |
| 2014/0035014 | A1 | 2/2014 | Jeon | |
| 2014/0098591 | A1 | 4/2014 | Chen et al. | |
| 2015/0078062 | A1 | 3/2015 | Lu et al. | |
| 2015/0287730 | A1 | 10/2015 | Wu et al. | |
| 2015/0348631 | A1 | 12/2015 | Matsumoto et al. | |
| 2016/0049190 | A1 | 2/2016 | Han et al. | |
| 2016/0293612 | A1 | 10/2016 | Park | |
| 2017/0076765 | A1 | 3/2017 | Huang | |

OTHER PUBLICATIONS

Kurjanowicz, W., "Evaluating Embedded Non-Volatile Memory for 65nm and Beyond," DesignCon 2008, Sidense Corp., 2008, 23 pages.

Kurjanowicz, W., "Evaluating Embedded Non-Volatile Memory for 65nm and Beyond," DesignCon 2008, International Engineering Consortium, DesignCon 2008, Feb. 4-7, 2008, pp. 176-188.

* cited by examiner

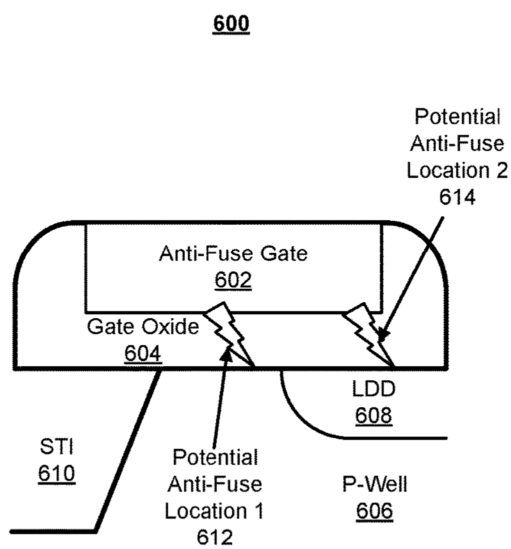
FIG. 6
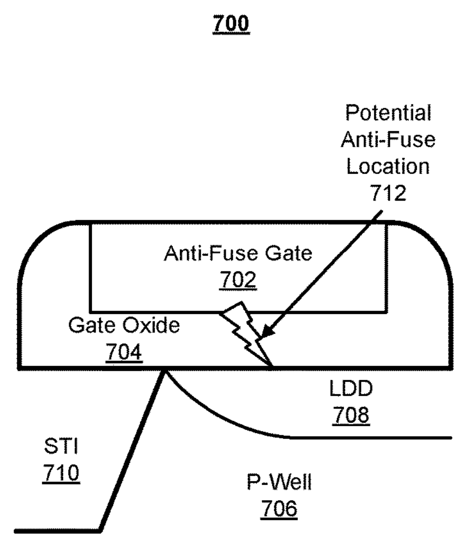
FIG. 7
800
| | Bitline | Wordline Selected | WL Unselected | Fuse Selected | Fuse Unselected |
|---|---|---|---|---|---|
| Read Selected Row | 0 | VDD_IO | 0 | VDD | 0 |
| Read Unselected Row | 0 | 0 | 0 | 0 | 0 |
| Prog Selected Row - Rupt | 0 | VDD_IO | 0 | Vrupt | 0 |
| Prog Selected Row - Inhibit | VDD_IO | VDD_IO | 0 | Vrupt | 0 |
| Prog Unselected Row | X | 0 | 0 | 0 | 0 |
FIG. 8

ONE-TIME PROGRAMMABLE BITCELL WITH NATIVE ANTI-FUSE

CROSS REFERENCE TO RELATED APPLICATION

This application claims the benefit of U.S. Provisional Application No. 62/411,450, entitled "ONE TIME PROGRAMMABLE (OTP) BITCELL WITH SOURCE/DRAIN IMPLANT BLOCKED OVER FUSE," filed Oct. 21, 2016, which is incorporated by reference herein in its entirety.

BACKGROUND

This disclosure relates to one-time programmable bitcell, and more specifically to a one-time programmable bitcell with reduced leakage at its anti-fuse device.

As the semiconductor industry continues to integrate more and more devices onto a single chip, the need for OTP memory on BCD (Bipolar CMOS DMOS) processes is increasing. High voltage devices (DMOS) are being added to standard logic (CMOS) processes. For example, LCD screens used on many smart phones and other screens use thin film transistors that operate at 32V. Accelerometers used to sense orientation in smart phones, acceleration in anti-lock brakes, and other MEMS devices usually operate between 40V and 60V. This has resulted in many BCD process that combine small, low voltage CMOS devices, high voltage DMOS devices, IO/bridge devices (typically 5V CMOS devices), and other devices all on one chip.

There is a desire to add NVM (Non Volatile Memory) into these chips as well. The NVM can be used to store analog calibration values. As one example, gamma correction for LCD screens can be stored in the NVM. When LCD screens are mass produced, the screens are designed to produce exactly the same color intensities. To correct for manufacturing variations, each screen is tested and a correction value (gamma) is stored on the LCD control chip to compensate for any small variation in manufacturing. As another example, code used by MEMS microcontroller chips can be stored as NVM on BCD chips. Currently available memory devices include EEPROM and eFLASH, both of which have disadvantages. eFLASH has a very small bitcell, but it requires steps in addition to the standard CMOS process, which increases the cost of producing the bitcell and may change the performance or characteristics of the produced devices. EEPROM is compatible with standard CMOS processes, but has a relatively large bitcell size, and thus is only suitable for low bit count memories.

As an alternative, One-Time Programmable (OTP) Gate Oxide rupture memories can be used as NVM on BCD chips. OTP Gate Oxide memories typically include an anti-fuse device having a thin oxide layer and a select device having a thicker oxide layer. The anti-fuse and select devices are connected in series. OTP Gate Oxide memories typically use an electric field of around 30 MV/cm to rupture anti-fuses in the thin oxide of the anti-fuse devices. This 30 MV/cm is a compromise voltage that balances the demands of programming speeds and stresses on the chip. Many applications program the OTP memory at test, and testing time is a significant portion of the total manufacturing cost of a chip. Using higher voltages reduces the programming time, thus reducing test costs and overall manufacturing cost. However, higher voltages place higher stress on the other devices in the memory, including the select device in the bitcell. Typically, 30 MV/cm provides a reasonable programming time and tolerable amount of stress on the peripheral devices. In a typical 0.13 um 1.5V/5V process, 30 MV/cm on the 1.5V device is around 10V. However, a 10V rupture voltage is often higher than the diode breakdown voltage between the source/drain and the well in which the bitcell is formed; the diode breakdown voltage is usually around 8.5V. As anti-fuses are blown during programming, a common leakage path between bitcells is created. The combined leakage of many previously-programmed bitcells makes it difficult to blow the anti-fuses in later-programmed bitcells.

SUMMARY

Embodiments relate to a one-time programmable (OTP) memory device having an anti-fuse device positioned partially over a lightly doped drain (LDD) region. The OTP memory device has an increased breakdown voltage between the LDD region and a well region of opposite doping by using a low doping concentration in the LDD. A salicide may be formed over a portion of the OTP memory device, including a source/drain region (or "source region or drain region"), but the salicide is blocked in the LDD region.

In some embodiments, the OTP memory device includes a well region of a first polarity in a semiconductor substrate. A lightly-doped drain (LDD) region is above a first portion of the well region. The LDD region is doped with a first doping concentration and with a second polarity that is opposite the first polarity. A source region or a drain region is above a second portion of the well region. The source region or drain region is doped with the second polarity and with a second doping concentration that is higher than the first doping concentration. A first breakdown voltage between the LDD region and the well region is higher than a second breakdown voltage between the source region or the drain region and the well region. A select device is positioned at least in part above a portion of the source region or drain region. The select device is configured to form a channel between the LDD region and the source region or drain region. An anti-fuse device is positioned at least in part above a portion of the LDD region.

In some embodiments, an OTP memory device is fabricated on a semiconductor substrate of a first polarity. A first gate for a select device and a second gate for an anti-fuse device are formed on the semiconductor substrate. A portion of the semiconductor substrate between the first gate and the second gate is implanted with a first doping concentration to form a lightly-doped drain (LDD) region. The LDD region is a second polarity that is opposite the first polarity, and the LDD region extends under at least a portion of the first gate. A different portion of the semiconductor substrate is implanted with a second doping concentration higher than the first doping concentration to form a source region or a drain region of the second polarity. A portion of the first gate and a portion of the second gate are implanted with the second doping concentration of the second polarity to form the select device and the anti-fuse device.

BRIEF DESCRIPTION OF DRAWINGS

FIG. 6 is a cross sectional diagram of an anti-fuse device with two potential anti-fuse locations, according to one embodiment.

FIG. 7 is a cross sectional diagram of an anti-fuse device in which the LDD region extends further into the anti-fuse device, according to one embodiment.

FIG. 8 is a table of operation voltages of an OTP memory device according to one embodiment.

DETAILED DESCRIPTION

Figure 1:
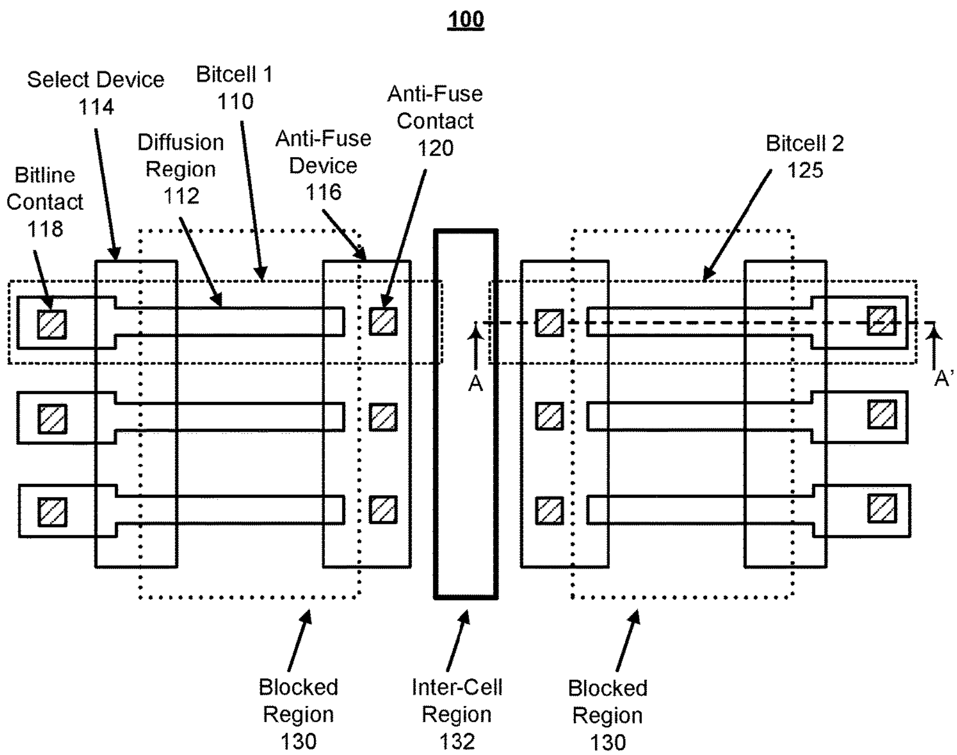
FIG. 1 illustrates a top view of an OTP memory device, according to one embodiment.

Embodiments relate to a one-time programmable (OTP) memory device that uses low doping in low-doped drain (LDD) region adjacent to an anti-fuse device so that the voltage needed to rupture an anti-fuse and program a cell is higher than the breakdown voltage between the LDD and the well in which the LDD is formed. Further, the breakdown voltage between the LDD and the well is higher than the breakdown voltage between a standard drain region and the well.

To reduce or remove leakage around the anti-fuse devices from previously-programmed gate rupture bitcells caused by a low diode breakdown voltage, the anti-fuse devices can be placed over or partially over an LDD region that has a lower doping concentration than a standard drain region. For an NMOS bitcell, the breakdown voltage between a LDD region (e.g., an N-doped drain region, or "N-LDD") and an opposite-doped well (e.g., a p-well) increases as the doping concentration of the LDD decreases. In a typical CMOS process, the p-well has a concentration on the order of $10^{17}$ dopant ions/cm$^3$, and a typical N-doped source/drain ("N+ S/D") has a dopant concentration on the order of $10^{20}$ dopant ions/cm$^3$. An N-LDD has a lower dopant concentration, on the order of $10^{19}$ dopant ions/cm$^3$. By lowering the dopant concentration in the drain region to $10^{19}$ dopant ions/cm$^3$ from $10^{20}$ dopant ions/cm$^3$, the breakdown voltage is much higher. Thus, to reduce leakage around the anti-fuse devices, the anti-fuse devices can be placed over an N-LDD region, rather than an N+S/D. The use of a low doped drain is described below in detail with reference to FIGS. 1 through 4.

In some CMOS processes, a salicide is formed over the device to reduce the resistance of the diffusion region and the gates. A salicide is a self-aligned silicide that is formed by reacting metal with silicon. Forming a salicide consumes silicon on the wafer, and the salicide partially embeds into the silicon. During programming, the anti-fuse is ruptured by applying a high voltage to the anti-fuse to form a rupture in the gate oxide of the anti-fuse device, thus shorting the anti-fuse device to the LDD region. However, the low doping in the LDD region may not be sufficient to buffer a salicide formed on, and extending into, the LDD region from the well underneath the LDD region (e.g., a p-well underneath an N-LDD). In particular, if the depletion layer of the LDD region formed at the junction of the LDD-region and the well touches the salicide layer, high leakage will occur from the salicide to the well. Thus, during a salicide process, the LDD region is blocked to prevent salicide from forming on the LDD region.

The bitcell may be created using a standard complementary metal-oxide-semiconductor manufacturing processes ("CMOS processes"). "OTP bitcell," "bitcell" or "bit" described herein refers to CMOS type (i.e., transistor based) nonvolatile memory. A CMOS OTP bitcell is distinguished from other types of NVM memory such as magnetic memory, such as is found in floppy disks, or optical memory such as is found in CDs or DVDs. OTP bitcells are produced using a CMOS process that includes a number of process steps in a fabrication facility ("fab").

OTP Memory Device with Low Doped Drain

FIG. 1 illustrates a top view of an OTP memory device 100, according to one embodiment. The memory device 100 includes multiple bitcells, such as bitcell 1 110 and bitcell 2 125. Bitcell 1 110 bitcell includes a diffusion region 112, a select device 114, an anti-fuse device 116, a bitline contact 118, and an anti-fuse contact 120. During fabrication of the memory device 100, the blocked region 130 is blocked from N+ source/drain ("N+SD") implantation to form a low-doped drain (LDD). An inter-cell region 132 may separate the regions between columns of bitcells. For example, the inter-cell region 132, and other areas of the device outside of the diffusion region 112, may be a shallow trench isolation (STI). Each bitcell, such as bitcell 2 125 and the other unlabeled bitcells in the memory device 100, includes the same components 112 through 120. While the memory device 100 is shown having six bitcells, the memory device 100 may have many more bitcells than are shown in FIG. 1, and may be arranged differently than shown in FIG. 1.

The diffusion region 112 extends across the bitcell 110. A source/drain and an LDD (not shown in FIG. 1) are implanted into the diffusion region 112, shown in and described with respect to FIG. 2. The bitcell 110 has two devices, a select device 114 and an anti-fuse device 116. The select device 114 includes a conductive gate and a thick gate oxide that is below the conductive gate, as described below in detail with reference to FIG. 2. The select device 114 is configured to form a channel in a channel region of the diffusion region 112 between the source/drain and the LDD. The bitline contact 118 connects through the thick gate oxide to apply a voltage to a source/drain region (or "source region or drain region") next to the select device 114. The anti-fuse device 116 includes a conductive gate and a thin gate oxide below the conductive gate. The anti-fuse contact 120 applies a voltage to the anti-fuse device 116.

During fabrication, a low level of doping, e.g., on the order of $10^{19}$ dopant ions/cm$^3$, is implanted across the diffusion region 112 to form the LDD. Then, the region 130 is blocked, and additional implantation in a portion of the diffusion region 112 outside the blocked region 130 forms a source/drain region near the bitline contact 118 and select device 114 with a higher doping concentration, e.g., on the order of $10^{20}$ dopant ions/cm$^3$. Because the region 130 only blocks a portion of the select device 114 and the anti-fuse device 116, the additional implantation also increases the dopant concentration in the exposed portions of the select device 114 and the anti-fuse device 116. The N+ implant diffuses across polysilicon, so that the N-doping is uniform across the polysilicon of the select device 114 and the anti-fuse device 116.

Figure 2:
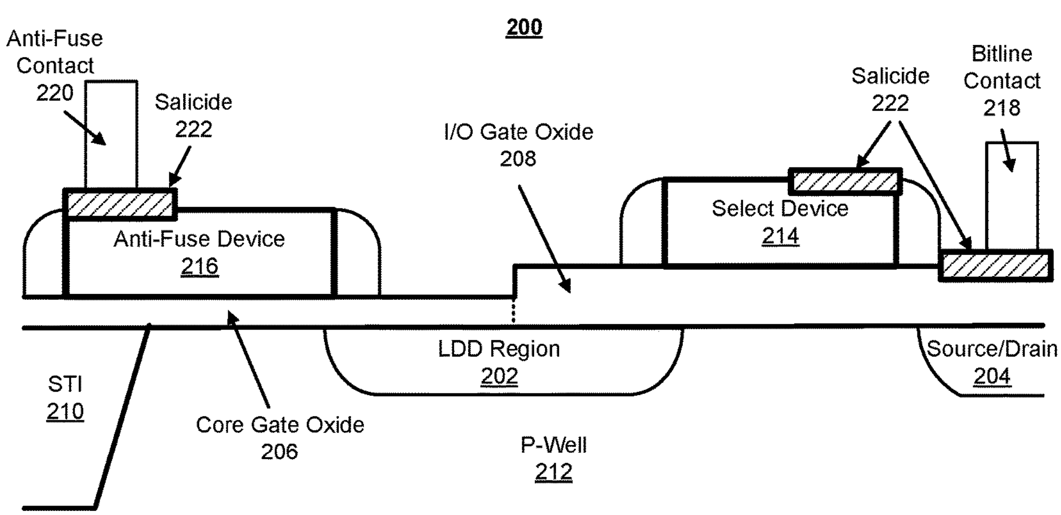
FIG. 2 is a cross sectional diagram an OTP bitcell taken along line A-A' of FIG. 1, according to one embodiment.

If a salicide process is performed, a resist protect oxide (RPO) is applied to the same blocked region 130 during the salicide process to prevent salicide from forming in this region 130, as described further with respect to FIG. 2. In some embodiments, the region blocked during the salicide process does not line up exactly with the region 130 blocked from the N+ doping.

FIG. 2 is a cross sectional diagram an OTP bitcell 200 taken along line A-A' of FIG. 1, according to one embodiment. The OTP bitcell 200 corresponds to the bitcell 2 125 in FIG. 1. The bitcell 200 includes an LDD region 202, a source/drain region 204, a core gate oxide 206, an I/O gate oxide 208, an STI 210, a p-well 212, a select device 214, an anti-fuse device 216, a bitline contact 218, and anti-fuse contact 220, and salicide 222.

The LDD region 202 is formed between the anti-fuse device 216 and the select device 214. The LDD region 202, select device 214, source/drain 204, and I/O gate oxide 208 form a first transistor in which a channel region can form between the LDD region 202 and the source/drain 204 and through the p-well 212. A bitline contact 218, like bitline contact 118, applies a voltage to the source/drain 204 through the salicide 222 and I/O gate oxide 208.

The anti-fuse device 216 is used to program the bitcell 200. The anti-fuse device 216 has no source region, and the LDD 202 is the drain of the anti-fuse device 216. The core gate oxide 206 extends under the anti-fuse device 216, and a thicker I/O gate oxide 208 extends under the select device 214. During programming of the bitcell 200, the anti-fuse contact 220 applies a high voltage to the anti-fuse device 216 through the salicide 222, while the LDD region 202 is grounded. This high voltage difference ruptures a portion of the core gate oxide 206, creating a short or an "anti-fuse" (not shown in FIG. 2) that allows current to flow though the core gate oxide 206 during reading of the bitcell 200.

As shown in FIG. 2, the LDD region 202 and source/drain 204 are formed within the p-well 212. As discussed above, a junction of the p-well 212, which has a doping concentration on the order of $10^{17}$ dopant ions/$cm^3$, and a standard N+ source/drain region, which has a doping concentration on the order of $10^{20}$ dopant ions/$cm^3$, would have a relatively low diode breakdown voltage that is lower than the voltage needed to rupture an anti-fuse at the anti-fuse device 216. By contrast, the junction of the p-well 212 and the LDD region 202, which has a doping concentration on the order of $10^{19}$ dopant ions/$cm^3$, has a diode breakdown voltage that is higher than the voltage needed to rupture an anti-fuse in the core gate oxide 206. In some embodiments, the breakdown voltage between the LDD region 202 and the p-well 212 is 1.5 V higher than a breakdown voltage between the source/drain 204 (which has a doping concentration on the order of $10^{20}$ dopant ions/$cm^3$) and the p-well 212. The doping of the LDD region 202 and/or the p-well 212 can be selected based on the rupture voltage and the breakdown voltage.

In some embodiments, a layer of salicide 222 is formed on the bitcell 200, and in particular, on a portion of the anti-fuse device 216, on a portion of the select device 214, and on the source/drain region 204. Salicide 222 can be formed by sputtering a layer of metal such as cobalt or nickel onto the entire wafer and heating the wafer using Rapid Thermal Annealing (RTA) so that the metal reacts with silicon to form a metal silicide. The temperature at which a metal reacts with a silicon dielectric (e.g., $SiO_2$, $Si_3N_4$, or SiON) is higher than the temperature at which the metal reacts with silicon. By limiting the temperature and the time during which the heat is applied during RTA, the metal combines with silicon it is in contact with, but will not combine with silicon dielectric material. This selective reaction to silicon is referred to as self-aligning to conductive silicon. After the RTA, the wafer is dipped in an acid to remove the unreacted metal. A second, hotter RTA step can be performed to further reduce the silicide resistance.

As shown in FIG. 2, salicide 222 is not formed over the LDD region 202. As discussed above, the low doping in the LDD region 202 is not sufficient to buffer a salicide if it were formed on the LDD region 202 from the p-well 212. In particular, if the depletion layer of the LDD region 202 formed at the junction of the LDD region 202 and the p-well 212 touched a salicide layer, there would be high leakage from the salicide to the p-well 212. This leakage would make it difficult to program adjacent bitcells. Thus, salicide 222 is not formed on the LDD region 202.

To block the salicide from forming on the LDD region 202, a resist protect oxide (RPO) can be deposited on the LDD region 202 and, in some embodiments, portions of the anti-fuse device 216 and select device 214 adjacent to the LDD region 202. RPO is also referred to as a salicide block layer (SB or SAB) and oxide protect layer (OP). After the salicide 222 is formed on other regions of the bitcell 200, the RPO is removed.

Alternate Configuration of an OTP Memory Device with Low Doped Drain

Figure 3:
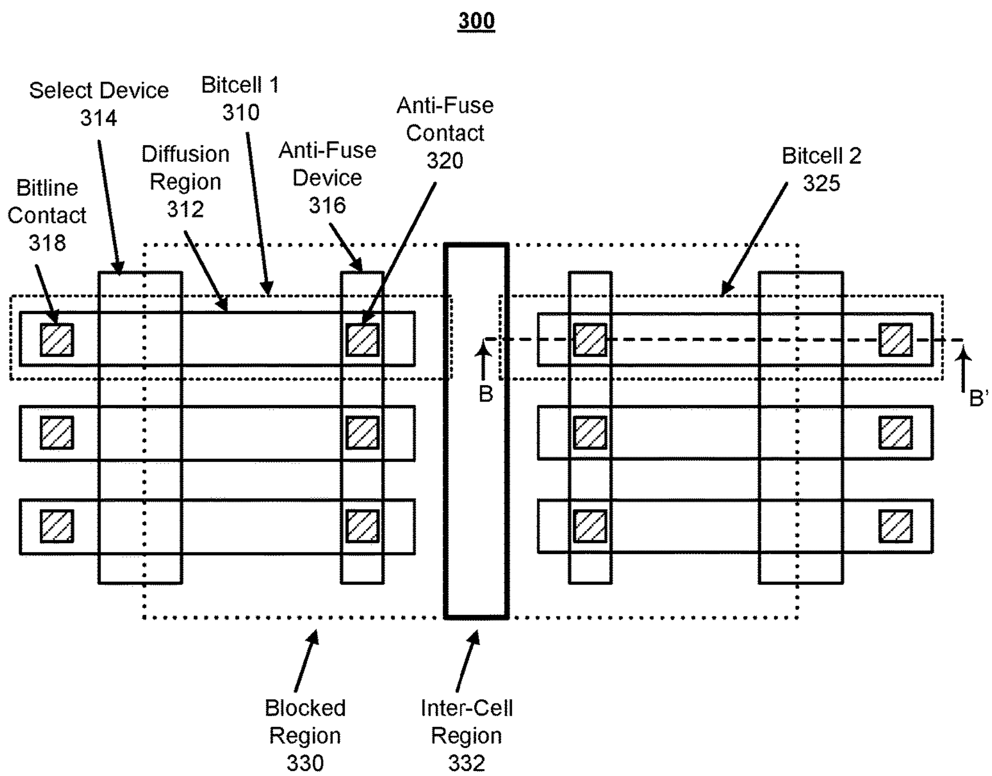
FIG. 3 is a top view of an OTP memory device fabricated using an alternative process, according to one embodiment.

FIG. 3 is a top view of an OTP memory device 300 fabricated using an alternate process from OTP memory device 100, according to one embodiment. The memory device 300 includes multiple bitcells, such as bitcell 1 310 and bitcell 2 325. Bitcell 1 310 bitcell includes a diffusion region 312, a select device 314, an anti-fuse device 316, a bitline contact 318, and an anti-fuse contact 320. Each bitcell, such as bitcell 2 325 and the other unlabeled bitcells in the memory device 300, includes the same components 312 through 320. These components are functionally similar to the components 112 through 120 described with respect to FIG. 1. In an alternate embodiment not shown, the contacts 320 are shifted to be in-between the anti-fuses of adjacent bitcells. However, the anti-fuse device 316 is narrower than the anti-fuse device 116 in FIG. 1, and the anti-fuse contact 320 and anti-fuse device 316 are formed over the diffusion region 312. In the memory device 300, the LDD region, which is part of the diffusion region 316, extends to under the full anti-fuse device to the inter-cell region 332. After polysilicon is deposited on the select device 314 and the anti-fuse device 316, but before the polysilicon is etched, the polysilicon is implanted. While the memory device 100 is shown having six bitcells, the memory device 100 may have many more bitcells than are shown in FIG. 1, and may be arranged differently than shown in FIG. 1.

During fabrication, a low level of doping, e.g., on the order of $10^{19}$ dopant ions/$cm^3$, is implanted across the diffusion region 312 to form the LDD. A polysilicon for the select device 314 and anti-fuse device 316 is deposited across the memory device 300 and N-doping is implanted in the polysilicon before the polysilicon is etched to form the select device 314 and anti-fuse device 316. This implantation is referred to as N-poly pre-doping. After etching the polysilicon, the blocked region 330 is blocked from further doping. Unlike the blocked region 130 in FIG. 1, the blocked region 330 extends fully across the anti-fuse devices 316 and the inter-cell region 332. While the region 330 is blocked, additional implantation in a portion of the diffusion region 312 outside the blocked region 330 forms a source/drain region near the bitline contact 318 and select device 314 with a higher doping concentration, e.g., on the order of $10^{20}$ dopant ions/$cm^3$. Because the region 330 only blocks a portion of the select device 314, the additional implantation also increases the dopant concentration in the exposed portion of the select device 314. The N+ implant diffuses across polysilicon, so that the N-doping is uniform across the polysilicon of the select device 314.

In this process, the anti-fuse device 316 receives less N-doping than the select device 314, but because of the pre-doping, it is conductive enough to be used and does not need further doping. Because the anti-fuse device 316 was already doped during the N-poly pre-doping, the anti-fuse 316 can be narrower than the anti-fuse device 116 in FIG. 1. The polysilicon of the anti-fuse device 116 in FIG. 1, which was not pre-doped, is N-doped during the N+ source/drain implantation, during which the LDD region and a portion of the select device 114 and anti-fuse device 116 are partially blocked (to ensure blocking of the LDD). The anti-fuse device 116 is wider than the anti-fuse device 316 because while a portion of the anti-fuse device 116 is blocked to protect the LDD, a wide enough portion to N-dope the whole anti-fuse device 116 (including the blocked portion) is unblocked for implantation.

Figure 4:
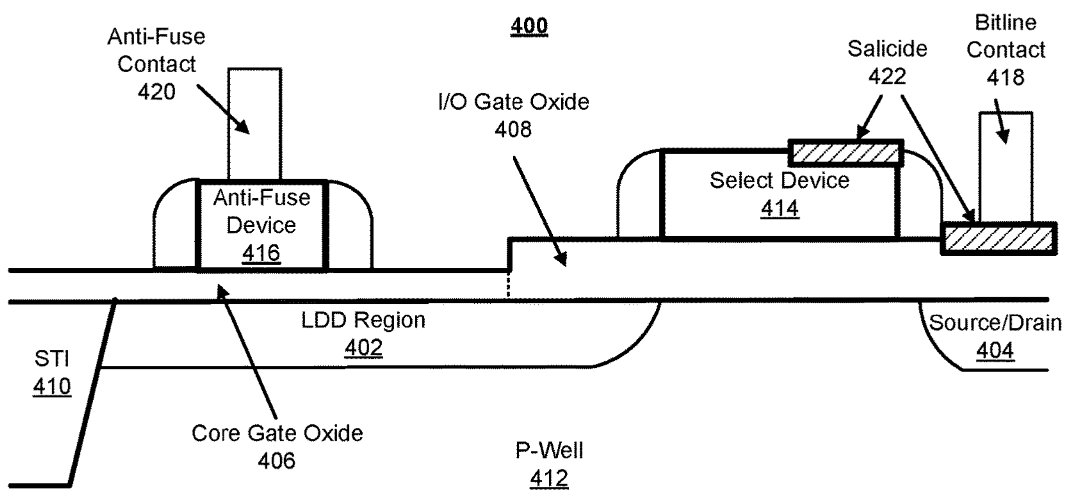
FIG. 4 is a cross sectional diagram an OTP bitcell taken along line B-B' of FIG. 3, according to one embodiment.

FIG. 4 is a cross sectional diagram an OTP bitcell 400 taken along line B-B' of FIG. 3, according to one embodiment. The OTP bitcell 400 corresponds to the bitcell 2 325 in FIG. 3. The bitcell 400 includes an LDD region 402, a source/drain region 404, a core gate oxide 406, an I/O gate oxide 408, an STI 410, a p-well 412, a select device 414, an anti-fuse device 416, a bitline contact 418, an anti-fuse contact 420, and salicide 422.

The LDD region 402 extends under the full anti-fuse device 416 and to the select device 414. The LDD region 402, select device 414, source/drain 404, and I/O gate oxide 408 form a first transistor in which a channel region can form between the LDD region 402 and the source/drain 404 and through the p-well 412. A bitline contact 418, like bitline contact 318, applies a voltage to the source/drain 404 through the salicide 422 and I/O gate oxide 408.

The anti-fuse device 416 is used to program the bitcell 400. The anti-fuse device 416 has no source region, and the LDD 402 is the drain of the anti-fuse device 416. The core gate oxide 406 extends under the anti-fuse device 416, and a thicker I/O gate oxide 408 extends under the select device 414. During programming of the bitcell 400, the anti-fuse contact 420 applies a high voltage to the anti-fuse device 416, while the LDD region 402 is grounded. This high voltage difference ruptures a portion of the core gate oxide 406, creating a short or an "anti-fuse" (not shown in FIG. 4) that allows current to flow though the core gate oxide 406 during reading of the bitcell 400. Because the LDD region 402 extends under the full anti-fuse device 416, there is no risk that the short will be formed between the anti-fuse device 416 and the p-well 412. As described further below with respect to FIGS. 6 and 7, it is preferable for the short to be formed between the anti-fuse device 416 and the LDD region 402.

As in FIG. 2, the junction of the p-well 412 and the LDD region 402, which may have a doping concentration on the order of $10^{19}$ dopant ions/$cm^3$, has a diode breakdown voltage that is higher than the voltage needed to rupture an anti-fuse in the core gate oxide 406. In some embodiments, the breakdown voltage between the LDD region 402 and the p-well 412 is 1.5 V higher than a breakdown voltage between the source/drain 404 (which has a doping concentration on the order of $10^{20}$ dopant ions/$cm^3$) and the p-well 412. The doping of the LDD region 402 and/or the p-well 412 can be selected based on the rupture voltage and the breakdown voltage.

As in FIG. 2, in some embodiments, a layer of salicide 422 is formed on the bitcell 400. In this embodiment, the salicide 422 is not formed on the anti-fuse device 416, which is within the blocked region 330, and under which the LDD region 402 extends. Instead, the salicide 422 is formed only on a portion of the select device 414 and on the source/drain region 404. The LDD region 402, STI 410, and portion of the select device 414 adjacent to the LDD region 402 can be blocked from salicide formation using an RPO, as described with respect to FIG. 2. The salicide 422 can be formed using the same procedure described with respect to FIG. 2.

Method for Fabricating an OTP Memory Device with Low Doped Drain

Figure 5:
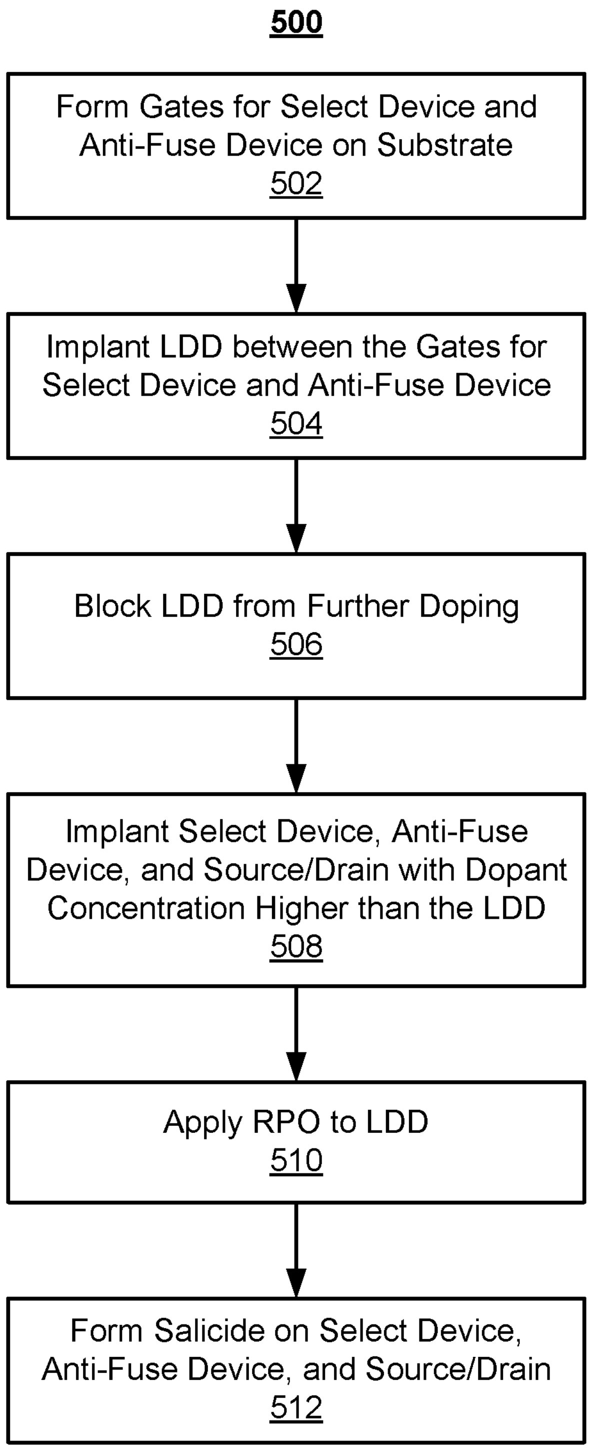
FIG. 5 is a flowchart illustrating a process for fabricating an OTP bitcell, according to one embodiment.

FIG. 5 is a flowchart illustrating a process 500 for fabricating an OTP bitcell, such as bitcells 100 and 200 described above. The OTP bitcell may be fabricated on a silicon substrate, such as a wafer. Before the process 500, the wafer may be implanted with a native doping or additional doping, and one or more well regions may be diffused or implanted into the substrate. Modifications of the process 500 for fabricating the bitcells 300 and 400 are described below.

Gates for a select device, such as select device 114 or 214, and an anti-fuse device, such as anti-fuse device 116 or 216, are formed 502 on the substrate. The gates may be formed by growing an oxide over the substrate, depositing polysilicon on the oxide, and etching the oxide and polysilicon from regions of the substrate that will not form the gates. The remaining oxide and polysilicon form the gates. As described above with respect to FIGS. 3 and 4, in some embodiments, the polysilicon is implanted before etching.

An LDD, such as LDD region 202, is implanted 504 between the gates for the select device and the anti-fuse device. For example, the low-doped drain may be implanted with a dopant concentration on the order of $10^{19}$ dopant ions/$cm^3$. In some embodiment, other regions of the substrate, such as the polysilicon of the gates for the select device and anti-fuse device, and an area that will form a source/drain region, may also be implanted, e.g., if these regions are not blocked.

After the LDD is implanted, it is blocked 506 from further doping. In some embodiments, the LDD and a portion of each of the select device and the anti-fuse device are blocked. In the embodiment described with respect to FIGS. 3 and 4 in which the N-poly is pre-doped before etching, the full anti-fuse device, which has already received a sufficient dopant concentration, is also blocked.

With the LDD blocked, the select device, anti-fuse device, and source/drain region are implanted 408 with a dopant concentration that is higher than the doping concentration of the LDD. For example, if the LDD is implanted with a dopant concentration on the order of $10^{19}$ dopant ions/$cm^3$, the dopant concentration for the source/drain region may be on the order of $10^{20}$ dopant ions/$cm^3$. The select device and anti-fuse device are partially blocked, and the dopants received diffuse into the blocked portions of the polysilicon in these devices. In the embodiment described with respect to FIGS. 3 and 4, only the select device and source/drain region receive the higher dopant concentration.

If a salicide process is used, a resist protect oxide (RPO) is applied 510 to the LDD. In some embodiments, the RPO is also applied to a portion of the select device and a portion of the LDD. In the embodiment described with respect to FIGS. 3 and 4, the RPO may also be applied to the anti-fuse device.

With the RPO applied, a salicide is formed 512 on the select device, anti-fuse device, and source/drain. The salicide process is described above in relation to FIG. 2. In the embodiment described with respect to FIGS. 3 and 4, the salicide may only be formed on the select device and source/drain, if the RPO is applied to the anti-fuse device. The RPO may be removed from the device after the salicide is formed, or during the salicide process (e.g., if the device is heated a second time after initial salicide formation and RPO removal).

Extending the Source/Drain Region Underneath the Anti-Fuse Device

FIG. 6 is a cross sectional diagram of an anti-fuse device 600 with two potential rupture locations, according to one embodiment. The anti-fuse device 600 includes an anti-fuse gate 602, gate oxide 604, p-well 606, LDD 608, and STI 610. The gate oxide 604 is a thin gate oxide in which an anti-fuse can be formed by applying a high voltage to the anti-fuse gate 602 and a low voltage (or ground) to the LDD 608. The LDD 608 is an n-doped example of a LDD region, such as LDD region 202 of FIG. 2. The p-well 606 is similar to p-well 212 or 412. STI 610 is a shallow trench isolation region for preventing current leakage.

A rupture can be formed at any point between the anti-fuse gate 602 and the p-well 606 or LDD 608. Two potential anti-fuse locations are shown for the anti-fuse device 600. The potential anti-fuse location 1 612 connects the anti-fuse gate 602 to the p-well 606. The potential anti-fuse location 2 614 connects the anti-fuse gate 602 to the LDD 608. When a high voltage is applied to the anti-fuse gate 602, an anti-fuse at either anti-fuse location 1 612 or anti-fuse location 2 614 could be formed. If the anti-fuse is formed between the anti-fuse gate 602 to the p-well 606 (e.g., at potential anti-fuse location 1 612), a high resistance path is created. In order to read the programmed bitcell, the voltage applied has to be high enough to form an N-type inversion region between the anti-fuse and the LDD 608. On the other hand, if the anti-fuse is formed directly between the anti-fuse gate 602 and the LDD 608 (e.g., at potential anti-fuse location 2 614), a low resistance path is formed, and a lower voltage can be used to read the bitcell. It is desirable for the anti-fuse to be formed at the same location in each bitcell, and in particular, for the anti-fuse to be formed at the potential anti-fuse location 2 in each bitcell.

FIG. 7 is a cross sectional diagram of an anti-fuse device 700 in which the LDD 708 extends further into the anti-fuse device 700, according to one embodiment. The anti-fuse device 700 includes an anti-fuse gate 702, gate oxide 704, p-well 706, LDD 708, and STI 710. The LDD 708 is wider than the LDD 608 shown in FIG. 6. The LDD 608 has been replaced with an LDD 708 that resembles one normally used in an IO/bridge device; the LDD region is typically larger and more graded in higher voltage devices. The LDD 708 extends to STI 710, so that the gate oxide 704 is formed entirely over the STI 710 or the LDD 708. When an anti-fuse is formed in the gate oxide 704, such as at potential anti-fuse location 712, the anti-fuse cannot connect the anti-fuse gate 702 to the p-well 706. Instead, the anti-fuse connects the anti-fuse gate 702 directly to the LDD 708. Thus, the anti-fuse always forms a low resistance path, and a lower voltage can be used to read the bitcell than if the anti-fuse were formed in the memory device 600 of FIG. 6 at potential anti-fuse location 1 612. The embodiment shown in FIGS. 3 and 4, which has a narrower anti-fuse gate 416 allowing LDD implantation on either side of the anti-fuse device 416, has the same advantage.

Example Table of Operations

FIG. 8 is a table of operation voltages of an OTP memory device according to one embodiment. The table of operation provides the voltage levels at different points in a memory device (given along the top of the table) and for different operations (given along the left side of the table). Vrupt is the high voltage used to rupture the gate oxide when a bitcell is being programmed. VDD refers to the power supply voltage for the core logic device, such as 1.8V in a 1.8V/5V process. VDD_IO refers to the power supply voltage for the logic device, such as 5V in a 1.8V/5V process.

Overview of Electronic Design Automation Design Flow

Figure 9:
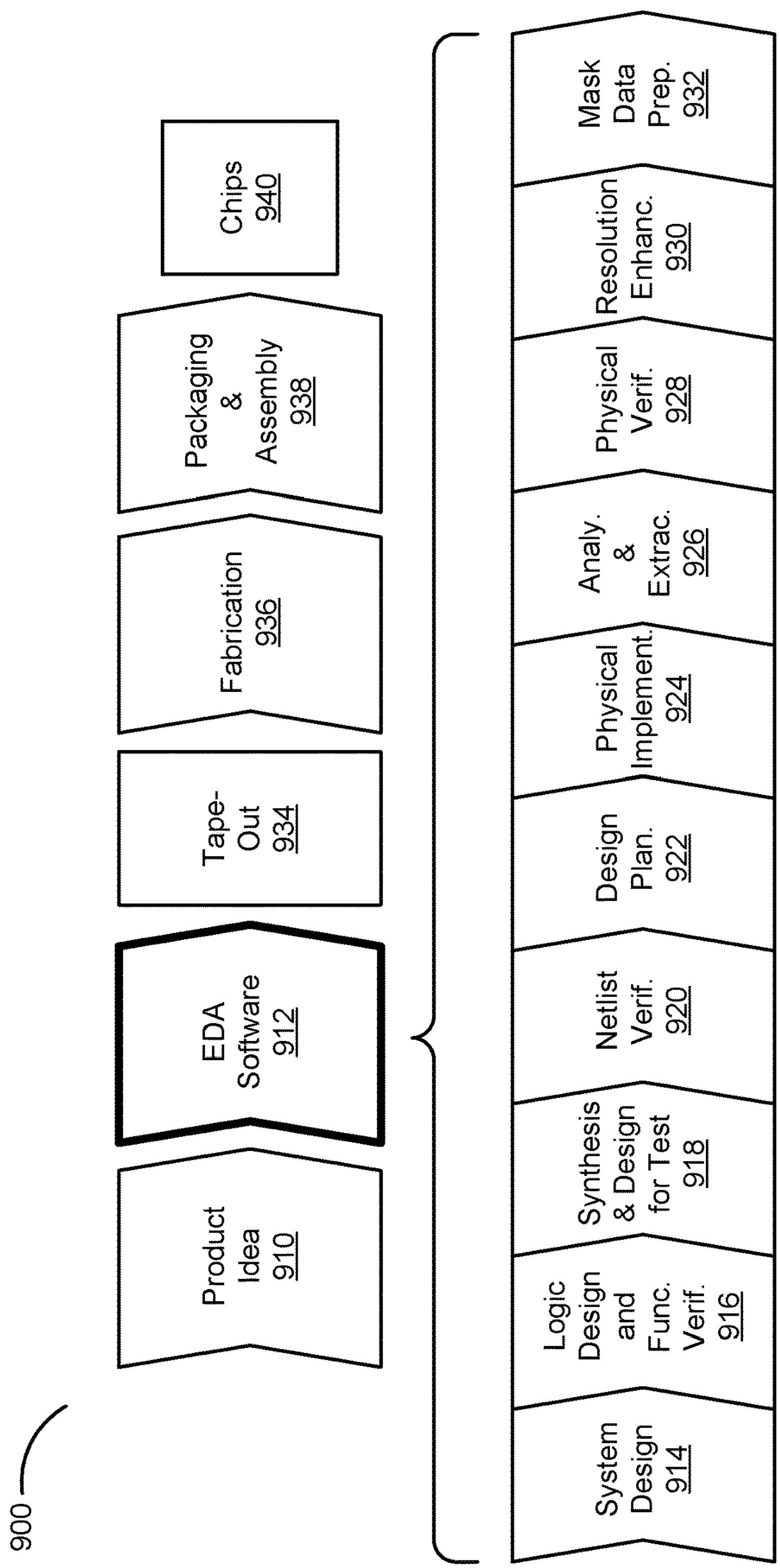
FIG. 9 is a flowchart illustrating the various operations in the design and fabrication of an integrated circuit, according to one embodiment.

FIG. 9 is a flowchart 900 illustrating the various operations in the design and fabrication of an integrated circuit. This process starts with the generation of a product idea 910, which is realized during a design process that uses electronic design automation (EDA) software 912. When the design is finalized, it can be taped-out 934. After tape-out, a semiconductor die is fabricated 936 to form the various objects (e.g., a bitcell including gates, metal layers, vias) in the integrated circuit design. Packaging and assembly processes 938 are performed, which result in finished chips 940.

The EDA software 912 may be implemented in one or more computing devices including a memory. An example of a memory is a non-transitory computer readable storage medium. For example, the EDA software 912 is stored as instructions in the computer-readable storage medium which are executed by a processor for performing operations 914-932 of the design flow, which are described below. This design flow description is for illustration purposes. In particular, this description is not meant to limit the present disclosure. For example, an actual integrated circuit design may require a designer to perform the design operations in a difference sequence than the sequence described herein.

A cell library incorporating one or more NVM bitcells or circuits as described above with reference to FIGS. 1A through 6 may be stored in the memory. The cell library may be referenced by the EDA software 912 to create a circuit or electronic device incorporating the NVM bitcells or circuits.

During system design 914, designers describe the functionality to implement. They can also perform what-if planning to refine the functionality and to check costs. Note that hardware-software architecture partitioning can occur at this stage. During logic design and functional verification 916, VHDL or Verilog code for modules in the circuit is written and the design is checked for functional accuracy. More specifically, the design is checked to ensure that it produces the correct outputs. During synthesis and design for test 918, VHDL/Verilog is translated to a netlist. This netlist can be optimized for the target technology. Additionally, tests can be designed and implemented to check the finished chips. During netlist verification 920, the netlist is checked for compliance with timing constraints and for correspondence with the VHDL/Verilog source code.

During design planning 922, an overall floor plan for the chip is constructed and analyzed for timing and top-level routing. Example EDA software products from Synopsys, Inc. of Mountain View, Calif. that can be used at this stage include: Astro® and IC Compiler® products. During physical implementation 924, the placement (positioning of circuit elements) and routing (connection of the same) occurs. During analysis and extraction 926, the circuit function is verified at a transistor level, which permits refinement. During physical verification 928, the design is checked to ensure correctness for: manufacturing, electrical issues, lithographic issues, and circuitry. During resolution enhancement 930, geometric manipulations of the layout are performed to improve manufacturability of the design. During mask-data preparation 932, the 'tape-out' data for production of masks to produce finished chips is provided.

Embodiments of the present disclosure can be used during one or more of the above-described stages. Specifically, in some embodiments the present disclosure can be used in EDA software 912 that includes operations between design planning 922 and physical implementation 924.

Figure 10:
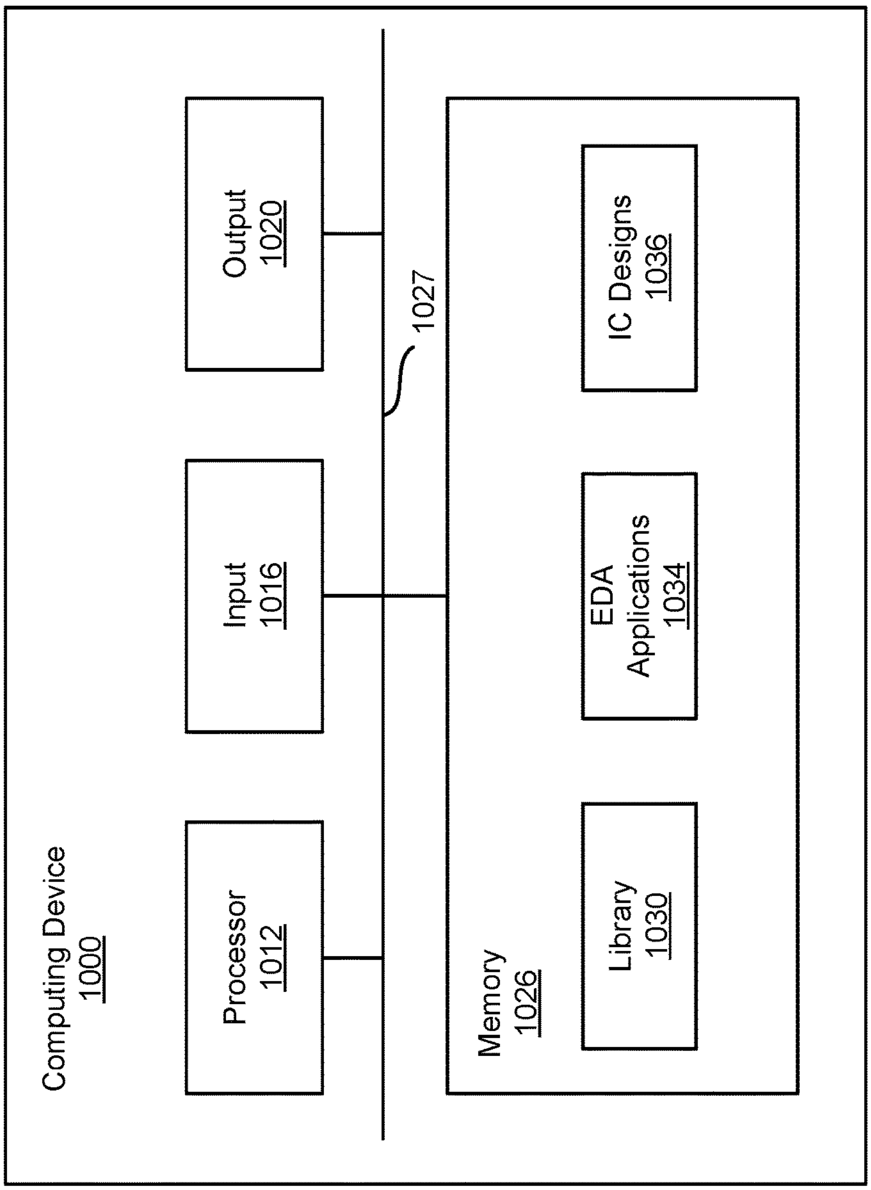
FIG. 10 is a block diagram of a computing device for designing a circuit, according to one embodiment.

FIG. 10 is a block diagram of a computing device 1000 for performing designing operations associated with OTP memory devices. The computer device 1000 may include, among other components, a processor 1012, an input module 1016, an output module 1020, a memory 1026 and a bus 1027 for connecting these components. The processor 1012 executes instructions stored in the memory 1026. The input module 1016 may include various devices for receiving user input, including keyboards and pointing devices (e.g., mouse and touch screen). The output module 1020 includes a display device or interface device for communicating with the display device.

The memory 1026 is a non-transitory computer readable storage medium storing, among others, library 1030, electronic design automation (EDA) applications 1034 and integrated circuit (IC) designs 1036. The library 1030 may include data on various circuit components, including instances of OTP memory device describe herein. The EDA applications 1034 may include various software programs for designing ICs, including place and route tools, synthesis tools, and verification tools. The design processed by the EDA applications 1034 may be stored in IC designs 1036. The IC designs 1036 may be an entire operational circuit or a part of a larger IC circuit.

Although the above embodiments were described primarily with reference to NMOS processes with n-doped source/drains, n-doped LDDs, and p-doped wells, the polarity of the substrate and the devices can be reversed. That is, the embodiments described herein are equally applicable to PMOS devices as well as NMOS devices.

The bitcell has wide applicability. For example, the bitcell may be used as an alternative to expensive flash memory. Flash memory is expensive because it requires a number of additional process steps to create that are not part of the standard CMOS logic process and it adds a significant amount of heat. In contrast, the bitcell can be constructed using the existing CMOS logic process with no additional process steps.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A one-time programmable memory device comprising:

a well region of a first polarity in a semiconductor substrate;

a lightly-doped drain (LDD) region above a first portion of the well region, the LDD region having a second polarity that is opposite the first polarity and having a first doping concentration;

a source region or a drain region of the second polarity above a second portion of the well region, the source region or the drain region having a second doping concentration that is higher than the first doping concentration, and a first breakdown voltage between the LDD region and the well region is higher than a second breakdown voltage between the source region or the drain region and the well region;

a select device positioned at least in part above a portion of the source region or the drain region, the select device configured to form a channel between the source region or the drain region and the LDD region;

an anti-fuse device positioned at least in part above a portion of the LDD region; and a shallow trench isolation (STI) region adjacent to the LDD region, wherein the LDD region extends underneath the anti-fuse device to the STI region.

2. The one-time programmable memory device of claim 1, wherein:

the select device comprises a gate oxide of a first thickness and a conductive gate above the gate oxide; and the anti-fuse device comprises a gate oxide of a second thickness thinner than the first thickness.

3. The one-time programmable memory device of claim 1, wherein the select device comprises a first implant having the second polarity, and the anti-fuse device comprises a second implant having the second polarity.

4. The one-time programmable memory device of claim 3, wherein a salicide is formed in the source region or the drain region and at least a portion of the second implant.

5. The one-time programmable memory device of claim 4, wherein a salicide is not formed in the LDD region.

6. The one-time programmable memory device of claim 1, wherein the first breakdown voltage between the LDD region and the well region is at least one volt higher than the second breakdown voltage between the source region or the drain region and the well region.

7. The one-time programmable memory device of claim 1, wherein the second doping concentration is higher than the first doping concentration by at least a factor of 10.

8. The one-time programmable memory device of claim 1, wherein the memory device is configured to be programmed by applying a rupture voltage at the anti-fuse device to rupture a gate oxide of the anti-fuse device.

9. A non-transitory computer-readable storage medium storing instructions thereon for execution by processor(s) to perform a method of manufacturing a one-time programmable memory device, the one-time programmable memory comprising:

a well region of a first polarity in a semiconductor substrate;

a lightly-doped drain (LDD) region above a first portion of the well region, the LDD region having a second polarity that is opposite the first polarity and having a first doping concentration;

a source region or a drain region of the second polarity above a second portion of the well region, the source region or the drain region having a second doping concentration that is higher than the first doping concentration, and a first breakdown voltage between the LDD region and the well region is higher than a second breakdown voltage between the source region or the drain region and the well region;

a select device positioned at least in part above a portion of the source region or the drain region, the select device configured to form a channel between the source region or the drain region and the LDD region;

an anti-fuse device positioned at least in part above a portion of the LDD region; and a shallow trench isolation (STI) region adjacent to the LDD region, wherein the LDD region extends underneath the anti-fuse device to the STI region.

10. The non-transitory computer-readable storage medium of claim 9, wherein:

the select device comprises a gate oxide of a first thickness and a conductive gate above the gate oxide; and the anti-fuse device comprises a gate oxide of a second thickness thinner than the first thickness.

11. The non-transitory computer-readable storage medium of claim 9, wherein the select device comprises a first implant having the second polarity, and the anti-fuse device comprises a second implant having the second polarity.

12. The non-transitory computer-readable storage medium of claim 11, wherein a salicide is formed in the source region or the drain region and at least a portion of the second implant.

13. The non-transitory computer-readable storage medium of claim 12, wherein a salicide is not formed in the LDD region.

14. The non-transitory computer-readable storage medium of claim 9, wherein the first breakdown voltage between the LDD region and the well region is at least one volt higher than the second breakdown voltage between the source region or the drain region and the well region.

15. The non-transitory computer-readable storage medium of claim 9, wherein the second doping concentration is higher than the first doping concentration by at least a factor of 10.

16. The non-transitory computer-readable storage medium of claim 9, wherein the memory device is configured to be programmed by applying a rupture voltage at the anti-fuse device to rupture a gate oxide of the anti-fuse device.

* * * * *